(12) United States Patent
Chen

(10) Patent No.: US 6,466,427 B1
(45) Date of Patent: Oct. 15, 2002

(54) MICROELECTRONIC CAPACITOR STRUCTURE COMPATIBLE WITH COPPER CONTAINING MICROELECTRONIC CONDUCTOR LAYER PROCESSING

(75) Inventor: Sheng-Hsiung Chen, Tai Chung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/584,807

(22) Filed: May 31, 2000

(51) Int. Cl.[7] .................. H01G 4/228; H01L 27/108
(52) U.S. Cl. .................. 361/306.3; 361/321.5; 361/313; 361/321.1; 257/303; 257/306
(58) Field of Search ............ 361/306.3, 305, 361/321.1, 312, 311, 313, 301.1, 301.4, 321.5, 321.3, 320; 257/303, 306

(56) References Cited

U.S. PATENT DOCUMENTS

| | | | |
|---|---|---|---|
| 4,471,405 A | | 9/1984 | Howard et al. |
| 4,890,192 A | | 12/1989 | Smith |
| 5,156,998 A | * | 10/1992 | Chi et al. .................. 437/209 |
| 5,170,318 A | * | 12/1992 | Catala et al. .............. 361/323 |
| 5,555,486 A | * | 9/1996 | Kingon et al. .............. 361/305 |
| 5,576,928 A | * | 11/1996 | Summerfelt et al. ...... 361/321.1 |
| 5,741,721 A | | 4/1998 | Stevens |
| 5,946,567 A | | 8/1999 | Weng et al. |
| 5,973,911 A | * | 10/1999 | Nishioka .................. 361/313 |
| 5,978,207 A | * | 11/1999 | Anderson et al. ........ 361/311 |
| 6,146,959 A | * | 11/2000 | DeBoer et al. ........... 438/393 |

* cited by examiner

Primary Examiner—Dean A. Reichard
Assistant Examiner—Nguyen Ha
(74) Attorney, Agent, or Firm—Tung & Associates

(57) ABSTRACT

A method for fabricating a capacitor, and a capacitor fabricated employing the method. To practice the method, there is first provided a substrate. In accord with a first embodiment, there is then formed over the substrate a first capacitor electrode plate formed of a first copper containing conductor material. There is then formed upon the first capacitor electrode plate a first barrier layer. There is then formed upon the first barrier layer a capacitor dielectric layer. There is then formed upon the capacitor dielectric layer a second barrier layer. Finally, there is then formed upon the second barrier layer a second capacitor electrode plate formed of a second copper containing conductor material. The method contemplates a capacitor fabricated employing the method. In accord with a second embodiment, a capacitor dielectric material from which is formed the capacitor dielectric layer is not derived from a barrier material from which is formed the first barrier layer. The capacitors provide enhanced thermal interdiffusion stability and enhanced oxidation stability.

4 Claims, 3 Drawing Sheets

MICROELECTRONIC CAPACITOR STRUCTURE COMPATIBLE WITH COPPER CONTAINING MICROELECTRONIC CONDUCTOR LAYER PROCESSING

BACKGROUND OF THE INVENTION

1. Field of the Invention

The present invention relates generally to microelectronic structures within microelectronic fabrications. More particularly, the present invention relates to microelectronic structures fabricated with enhanced stability within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and patterned microelectronic conductor layer dimensions have decreased, it has become common in the art of microelectronic fabrication to employ when fabricating microelectronic fabrications patterned copper containing microelectronic conductor layers. Patterned copper containing microelectronic conductor layers are desirable in the art of microelectronic fabrication when fabricating patterned microelectronic conductor layers within microelectronic fabrications insofar as patterned copper containing microelectronic conductor layers typically provide microelectronic fabrications with enhanced microelectronic fabrication speed while simultaneously avoiding within microelectronic fabrications detrimental effects, such. as but not limited to detrimental electromigration effects.

While microelectronic fabrications fabricated employing patterned copper containing microelectronic conductor layers are thus desirable in the art of microelectronic fabrication, microelectronic fabrications fabricated employing patterned copper containing microelectronic conductor layers are nonetheless not entirely without problems in the art of microelectronic fabrication. In that regard, microelectronic fabrications having fabricated therein microelectronic structures, such as but not limited to microelectronic capacitor structures, fabricated employing patterned copper containing microelectronic conductor layers within microelectronic fabrications, while not being susceptible to detrimental effects such as electromigration effects, are often nonetheless susceptible to other detrimental effects, such as but not limited to interdiffusion effects and oxidation effects, which affect the stability (such as but not limited to electrical stability) of the microelectronic structures.

It is thus towards the goal of forming within microelectronic fabrications copper containing microelectronic structures with enhanced stability that the present invention is directed.

Various microelectronic structures having desirable properties, including microelectronic capacitor structures having desirable properties, have been disclosed in the art of microelectronic fabrication.

For example, Howard et al., in U.S. Pat. No. 4,471,405, discloses a thin film microelectronic capacitor structure for use within a microelectronic fabrication, and a method for fabricating the thin film microelectronic capacitor structure for use within the microelectronic fabrication, wherein the thin film microelectronic capacitor structure is formed with a capacitor electrode plate formed with enhanced stability for use within the microelectronic fabrication. To effect the foregoing result, the thin film microelectronic capacitor structure employs as a bottom capacitor electrode plate within the thin film microelectronic capacitor structure a laminate of a platinum layer formed upon a metal which forms upon thermal annealing with the platinum layer a stable intermetallic material layer.

In addition, Smith, in U.S. Pat. No. 4,890,192, discloses a thin film microelectronic capacitor structure for use within a microelectronic fabrication, and a method for fabricating the thin film microelectronic capacitor structure for use within the microelectronic fabrication, wherein the thin film microelectronic capacitor structure is formed with enhanced areal capacitance within the microelectronic fabrication. The thin film microelectronic capacitor structure realizes the foregoing object by employing when fabricating the thin film microelectronic capacitor structure a stack of three capacitor electrode plates separated by a pair of two capacitive dielectric layers interposed therebetween, where a middle capacitor electrode plate within the stack of three capacitor electrode plates is a patterned layer having a series of patterns separated by an additional series of dielectric spacer layers.

Further, Stevens, in U.S. Pat. No. 5,741,721, discloses a thin film microelectronic capacitor structure for use within a microelectronic fabrication, and a method for fabricating the thin film microelectronic capacitor structure for use within the microelectronic fabrication, wherein the thin film microelectronic capacitor structure is readily fabricated with enhanced performance properties while not incorporating heavy metals when fabricating the thin film microelectronic capacitor structure for use within the microelectronic fabrication. To realize the foregoing object, the thin film microelectronic capacitor structure employs when forming a bottom electrode plate within the thin film microelectronic capacitor structure a transition metal nitride material layer which may be thermally oxidized to form a capacitor dielectric layer within the thin film microelectronic capacitor structure.

Finally, Weng et al., in U.S. Pat. No. 5,946,567, discloses a thin film microelectronic capacitor structure for use within a microelectronic fabrication, and a method for fabricating the thin film microelectronic capacitor structure for use within the microelectronic fabrication, wherein the thin film microelectronic capacitor structure is formed with a uniform areal distribution of capacitance over a microelectronic substrate within which is fabricated the thin film microelectronic capacitor structure. To realize the foregoing object, the thin film microelectronic capacitor structure employs when forming an upper capacitor electrode plate within the thin film microelectronic capacitor structure a comparatively thin upper capacitor electrode plate contacting a capacitor dielectric layer within the thin film microelectronic capacitor structure, where the comparatively thin upper capacitor electrode plate in turn has formed thereupon a series of relatively uniformly spaced conductor stud layers which bridge to a comparatively thicker upper capacitor electrode plate further spaced from the capacitor dielectric layer within the thin film microelectronic capacitor structure.

Desirable in the art of microelectronic fabrication are additional methods and materials which may be employed for forming within microelectronic fabrications copper containing microelectronic structures, such as but not limited to copper containing microelectronic capacitor structures, with enhanced stability, such as but not limited to enhanced thermal diffusion stability and enhanced oxidation stability, which in turn provide enhanced electrical stability of the copper containing microelectronic structures.

It is towards the foregoing object that the present invention is directed.

SUMMARY OF THE INVENTION

A first object of the present invention is to provide for use within a microelectronic fabrication a copper containing microelectronic structure, and a method for fabricating the copper containing microelectronic structure.

A second object of the present invention is to provide the copper containing microelectronic structure and the method for fabricating the copper containing microelectronic structure in accord with the first object of the present invention, where the copper containing microelectronic structure is fabricated with enhanced stability.

A third object of the present invention is to provide a copper containing microelectronic structure and a method for fabricating the copper containing microelectronic structure in accord with the first object of the present invention and the second object of the present invention, which method is readily commercially implemented.

In accord with the objects of the present invention, there is provided by the present invention a copper containing microelectronic capacitor structure and a method for fabricating the copper containing microelectronic capacitor structure. To practice the method of the present invention, there is first provided a substrate. There is then formed over the substrate a first capacitor plate layer formed of a first copper containing conductor material. There is then formed upon the first capacitor plate layer a first barrier layer. There is then formed upon the first barrier layer a capacitor dielectric layer. There is then formed upon the capacitor dielectric layer a second barrier layer. Finally, there is then formed upon the second barrier layer a second capacitor plate layer formed of a second copper containing conductor material.

The method for fabricating the microelectronic capacitor structure in accord with the present invention contemplates the microelectronic capacitor structure fabricated in accord with the method for fabricating the microelectronic capacitor structure.

In accord with a second embodiment of the invention, there is also provided by the present invention a related microelectronic capacitor structure and a method for fabricating the related microelectronic capacitor structure. Within the related microelectronic capacitor structure, and in accord with the microelectronic capacitor structure of the first embodiment of the invention, there is employed a pair of barrier layers at least in part as a pair of capacitor plates within the microelectronic capacitor structure, and there is also employed for forming a capacitor dielectric layer within the microelectronic capacitor structure a dielectric material which does not derive from a material from which is formed the pair of capacitor plates.

The present invention provides a copper containing microelectronic structure and a method for fabricating the copper containing microelectronic structure, where the copper containing microelectronic structure is fabricated with enhanced stability. A first embodiment of the present invention realizes the foregoing object by employing when forming a microelectronic capacitor structure which employs a pair of capacitor electrode plates formed of a pair of copper containing conductor materials a pair of barrier layers which separates the pair of capacitor electrode plates from a capacitor dielectric layer which is also formed interposed between the pair of capacitor electrode plates.

A second embodiment of the present invention realizes the foregoing object by employing within a microelectronic capacitor structure which comprises a pair of barrier layers which serves in-part as a pair of capacitor electrode plates a capacitive dielectric layer formed from a material which does not derive from the material from which is formed the pair of barrier layers.

The method of the present invention is readily commercially implemented. The present invention employs methods and materials as are generally known in the art of microelectronic fabrication, but employed within the context of a specific ordering to provide a microelectronic capacitor structure in accord with the present invention. Since it is a specific ordering of methods and materials which provides at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a copper containing microelectronic structure, and a method for fabricating the copper containing microelectronic structure, where the copper containing microelectronic structure is fabricated with enhanced stability, such as but not limited to interdiffusion stability and oxidation stability. A first embodiment of the present invention realizes the foregoing object by employing when forming a microelectronic capacitor structure which employs a pair of capacitor electrode plates formed of a copper containing microelectronic conductor material a pair of barrier layers which separate the pair of capacitor electrode plates from a capacitor dielectric layer which is also formed interposed between the pair of capacitor electrode plates. A related second embodiment of the present invention realizes the foregoing object by employing when fabricating a microelectronic capacitor structure which, analogously with the first embodiment of the present invention, also employs a pair of barrier layers at least in part as a pair of capacitor electrode plates, a capacitor dielectric layer formed of a material which does not derive from a material from which is formed the pair of capacitor electrode plates.

The present invention may be employed for forming microelectronic capacitor structures within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
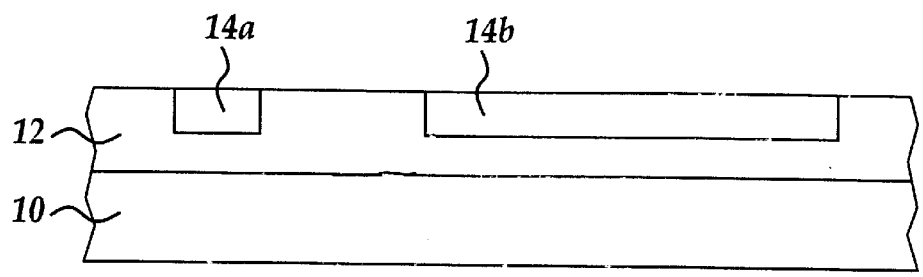
FIG. 1, FIG. 2, FIG. 3, FIG. 4 and FIG. 5 show a series of schematic cross-sectional diagrams illustrating the results of forming within a microelectronic fabrication in accord with a first preferred embodiment of the present invention a microelectronic capacitor structure within the microelectronic fabrication.

Referring now to FIG. 1 to FIG. 5, there is shown a series of schematic cross-sectional diagrams illustrating the results of forming, in accord with a first preferred embodiment of the present invention, a microelectronic capacitor structure within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 is a substrate 10 having formed thereover a dielectric substrate layer 12 which in turn has formed embedded therein a patterned first copper containing interconnect layer 14a and a first copper containing capacitor electrode plate 14b.

Within the first preferred embodiment of the present invention with respect to the substrate 10, the substrate 10 may be employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may consist of the substrate alone as employed within the microelectronic fabrication, or in the alternative, the substrate 10 may comprise the substrate as employed within the microelectronic fabrication, where the substrate has formed thereupon and/or thereover any of several additional microelectronic layers as are conventionally employed within the microelectronic fabrication within which is employed the substrate. Similarly with the substrate alone, such additional microelectronic layers may be formed of microelectronic materials selected from the group including but not limited to microelectronic conductor materials, microelectronic semiconductor materials and microelectronic dielectric materials.

Similarly, although also not specifically illustrated within the schematic cross-sectional diagram of FIG. 1, the substrate 10, particularly but not exclusively when the substrate 10 comprises or consists of a semiconductor substrate employed within a semiconductor integrated circuit microelectronic fabrication, has formed therein and/or thereupon microelectronic devices as are conventional within the microelectronic fabrication within which is employed the substrate 10. Such microelectronic devices may include, but are not limited to resistors, transistors, capacitors and diodes.

Within the preferred embodiment of the present invention with respect to the dielectric substrate layer 12, the dielectric substrate layer 12 may be formed from any of several dielectric materials as are conventional in the art of microelectronic fabrication, such dielectric materials being selected from the general groups including but not limited to comparatively higher dielectric constant silicon containing dielectric materials, such as but not limited to silicon oxide dielectric materials, silicon nitride dielectric materials and silicon oxynitride dielectric materials, as well as lesser conventional comparatively lower dielectric constant dielectric materials, such as but not limited to organic polymer spin-on-polymer (SOP) lower dielectric constant dielectric materials and silesequioxane spin-on-glass (SOG) lower dielectric constant dielectric materials.

Finally, within the preferred embodiment of the present invention with respect to the patterned first copper containing interconnect layer 14a and the first copper containing capacitor electrode plate 14b, the patterned first copper containing interconnect layer 14a and the first copper containing capacitor electrode plate 14b are typically and preferably formed of a pure copper conductor material formed employing an electroplating method, although copper containing conductor alloys formed employing plating methods or other deposition methods may also be employed for forming the patterned first copper containing interconnect layer 14a and the first copper containing capacitor electrode plate 14b. Typically and preferably, each of the patterned first copper containing interconnect layer 14a and the first copper containing capacitor electrode plate 14b is formed to a thickness of from about 4000 to about 10000 angstroms embedded within the dielectric substrate layer 12, while the patterned first copper containing interconnect layer 14a is typically and preferably formed to a bidirectional linewidth of from about 0.13 to about 0.44 microns, and while the first copper containing capacitor electrode plate 14b is formed to a bidirectional linewidth of from about 0.5 to about 5.0 microns.

Although not specifically illustrated within the schematic cross-sectional diagram of FIG. 1, each of the patterned first copper containing interconnect layer 14a and the first copper containing capacitor electrode plate 14b will typically have formed therebeneath and separating the patterned first copper containing interconnect layer 14a and the first copper containing capacitor electrode plate 14b from the dielectric substrate layer 12 a barrier layer, under circumstances where the dielectric substrate layer 12 is formed of a silicon containing dielectric material, and in particular of a silicon oxide silicon containing dielectric material which would otherwise be susceptible to interdiffusion with and oxidation of the copper containing material from which is formed the patterned first copper containing interconnect layer 14a and the first copper containing capacitor electrode plate 14b.

Figure 2:
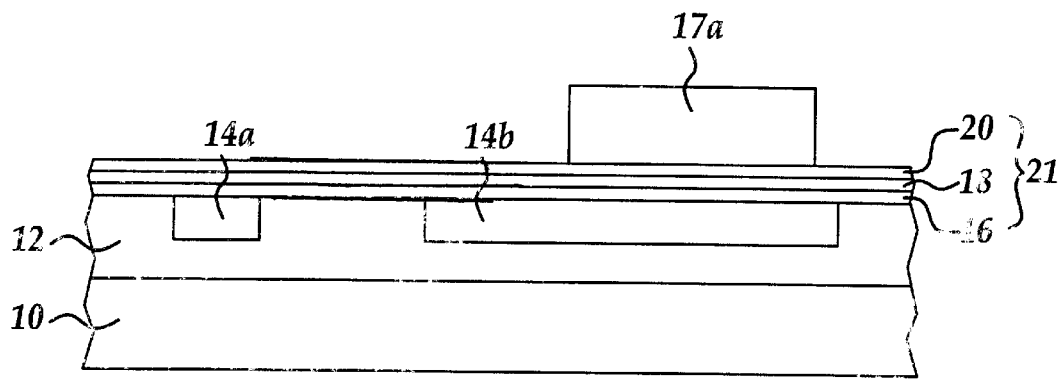

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed covering the exposed surfaces of the dielectric substrate layer 12, the patterned first copper containing interconnect layer 14a and the first copper containing capacitor electrode plate 14b a series of at least three blanket layers (but preferably only three blanket layers) which comprise a blanket stack layer 21. The series of at least three blanket layers comprises: (1) a blanket first barrier layer 16 formed upon the exposed surfaces of the dielectric substrate layer 12, the patterned first copper containing interconnect layer 14a and the first copper containing capacitor electrode plate 14b; (2) a blanket capacitor dielectric layer 18 formed upon the blanket first barrier layer 16; and (3) a blanket second barrier layer 20 formed upon the blanket capacitor dielectric layer 18.

Within the first preferred embodiment of the present invention with respect to each of the blanket first barrier layer 16 and the blanket second barrier layer 20, each of the blanket first barrier layer 16 and the blanket second barrier layer 20 is formed of a conductor barrier material which provides a barrier for interdiffusion and oxidation between the blanket capacitor dielectric layer 18 with either the first copper containing capacitor electrode plate 14b or a second copper containing capacitor electrode plate not otherwise shown in the schematic cross-sectional diagram of FIG. 2.

Within the present invention and the first preferred embodiment of the present invention, each of the blanket first barrier layer 16 and the blanket second barrier layer 20 is formed of a conductor barrier material, and thus each of the blanket first barrier layer 16 and the blanket second barrier layer 20 contributes to a thickness of each of the copper containing capacitor plates which they adjoin. Such conductor barrier materials from which may be formed the blanket first barrier layer 16 and the blanket second barrier layer 20 may be selected from the group including but not limited to refractory metal conductor barrier materials, nitrides thereof, alloys thereof and nitrides of alloys thereof, as well as aluminum or aluminum alloys of greater than about 95 weight percent aluminum, more preferably from about 99 to about 100 weight percent aluminum. Similarly, such refractory metal conductor barrier materials being selected from the group including but not limited to titanium, tungsten, vanadium, tantalum and molybdenum. More preferably, each of the blanket first barrier layer 16 and the blanket second barrier layer 20 is formed of a tantalum nitride conductor barrier material, titanium nitride conductor barrier material or an aluminum containing conductor material formed to a thickness of from about 150 to about 1,000 angstroms.

Within the preferred embodiment of the present invention with respect to the blanket capacitor dielectric layer 18, the blanket capacitor dielectric layer 18 may be formed of capacitor dielectric materials as are conventional in the art of microelectronic fabrication, including but not limited to silicon oxide dielectric materials, silicon nitride dielectric materials, silicon oxynitride dielectric materials, and laminates thereof. Typically and preferably, in order to provide optimal value when fabricating a microelectronic capacitor fabricated in accord with the present invention, at least a portion of the blanket capacitor dielectric layer 18 which contacts at least either the blanket first barrier layer 16 or the blanket second barrier layer 20 is formed of a silicon oxide capacitor dielectric material. Typically and preferably, the blanket capacitor dielectric layer 18 is formed to a thickness of from about 50 to about 500 angstroms. Finally, within the context of the present invention and the preferred embodiments of the present invention, the blanket capacitor dielectric layer 18 is typically and preferably: (1) not formed of a dielectric material which results from oxidation of the barrier material from which is formed the blanket first barrier layer 16; or (2) formed from a material which otherwise derives from the material from which is formed the blanket first barrier layer 16.

Finally, there is also shown within the schematic cross-sectional diagram of FIG. 2 a patterned first photoresist layer 17a formed upon the blanket second barrier layer 20 at a location above the first copper containing capacitor electrode plate 14b.

Within the first preferred embodiment of the present invention, the patterned first photoresist layer 17a may be formed employing methods and photoresist materials as are conventional in the art of microelectronic fabrication, such photoresist materials being selected from the general groups of photoresist materials including but not limited to positive photoresist materials and negative photoresist materials. Typically and preferably, the patterned first photoresist layer 17a is formed to a thickness of from about 8000 to about 16000 angstroms upon the blanket second barrier layer 20 while being formed above the first copper containing capacitor electrode plate 14b, where the patterned first photoresist layer 17a typically and preferably has a bidirectional linewidth of from about 0.4 to about 4.0 microns.

Figure 3:
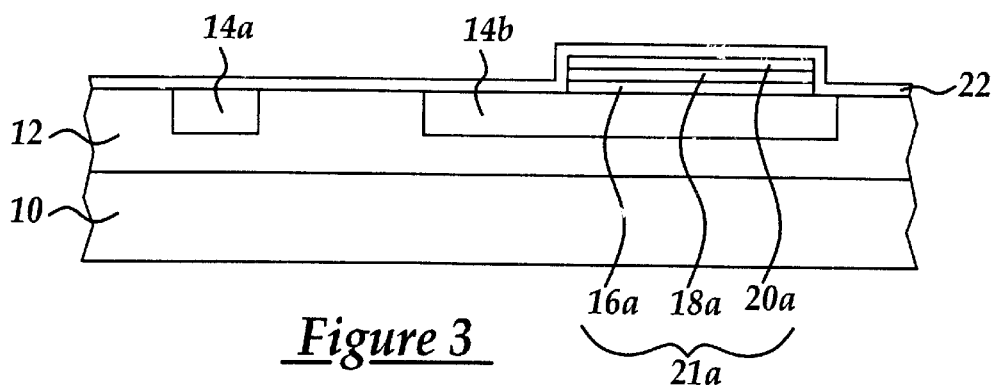

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein, in a first instance: (1) the blanket stack layer 21 comprising the blanket first barrier layer 16 having formed thereupon the blanket capacitor dielectric layer 18 in turn having formed thereupon the blanket second barrier layer 20 has been patterned to form a corresponding patterned stack layer 21a comprising a patterned first barrier layer 16a, having formed thereupon a patterned capacitor dielectric layer 18a in turn having formed thereupon a patterned second barrier layer 20a, while employing the patterned first photoresist layer 17a as an etch mask layer; and (2) the patterned first photoresist layer 17a is then stripped from the surface of the patterned second barrier layer 20a within the patterned stack layer 21a.

Within the first preferred embodiment of the present invention, the blanket stack layer 21 comprising the blanket first barrier layer 16 having formed thereupon the blanket capacitor dielectric layer 18 in turn having formed thereupon the blanket second barrier layer 20 may be patterned to form the corresponding patterned stack layer 21a comprising the patterned first barrier layer 16a having formed thereupon the patterned capacitor dielectric layer 18a in turn having formed thereupon the patterned second barrier layer 20a, while employing the patterned first photoresist layer 17a as a etch mask layer, while employing photolithographic and etch methods as are conventional in the art of microelectronic fabrication, such etch methods typically but not exclusively including reactive ion etch (RIE) plasma methods.

Similarly, within the first preferred embodiment of the present invention, the patterned first photoresist layer 17a may be stripped from the surface of the resulting patterned second barrier layer 20a within the patterned stack layer 21a to provide in part from the microelectronic fabrication whose schematic cross-sectional diagram is illustrated in FIG. 2 the microelectronic fabrication whose schematic cross-sectional diagram is illustrated in FIG. 3 while employing photoresist stripping methods as are similarly conventional in the art of microelectronic fabrication. Such photoresist stripping methods may include, but are not limited to dry plasma photoresist stripping methods, wet chemical photoresist stripping methods and combinations of dry plasma photoresist stripping methods and wet chemical photoresist stripping methods. Within the first preferred embodiment of the present invention, the patterned first photoresist layer 17a is typically and preferably stripped from the patterned second barrier layer 20a within the patterned stack layer 21a while employing a dry oxygen plasma photoresist stripping method followed by an organic solvent wet chemical stripping method.

There is also shown within the schematic cross-sectional diagram of FIG. 3 a blanket third barrier layer 22 formed in general covering the microelectronic fabrication whose schematic cross-sectional diagram is illustrated in FIG. 3 and more particularly formed upon exposed portions of the dielectric substrate layer 12, the patterned first copper containing interconnect layer 14*a*, the first copper containing capacitor electrode plate 14*b* and the patterned stack layer 21*a* comprising the patterned second barrier layer 20*a*, the patterned capacitor dielectric layer 18*a* and the patterned first barrier layer 16*a*.

Within the first preferred embodiment of the present invention, the blanket third barrier layer 22 is typically and preferably formed of a barrier material intended serve as a barrier for interdiffusion and oxidation between exposed portions of the patterned first copper containing interconnect layer 14*a* and the first copper containing capacitor electrode plate 14*b* and a silicon oxide dielectric layer subsequently formed thereover. Thus, within the first preferred embodiment of the present invention, the blanket third barrier layer 22 is typically and preferably formed of a dielectric barrier material, such as but not limited to a silicon nitride dielectric barrier material, formed to a thickness of from about 150 to about 1000 angstroms upon exposed portions of the dielectric substrate layer 12, the patterned first copper containing interconnect layer 14*a*, the first copper containing capacitor electrode plate 14*b* and the patterned stack layer 21*a* comprising the patterned first barrier layer 16*a*, the patterned capacitor dielectric layer 18*a* and the patterned second barrier layer 20*a*.

Figure 4:
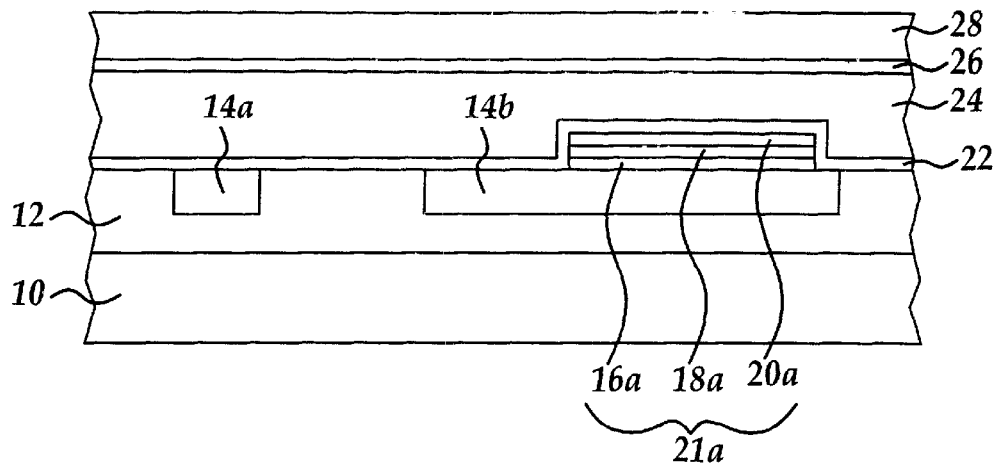

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein there is formed upon the blanket third barrier layer 22 a series of three additional barrier layers comprising: (1) a blanket first passivating dielectric layer 24 formed upon the blanket third barrier layer 22; (2) a blanket etch stop layer 26 formed upon the blanket first passivating dielectric layer 24; and (3) a blanket second passivating dielectric layer 28 formed upon the blanket etch stop layer 26. Within the first preferred embodiment of the present invention, each of the blanket first passivating dielectric layer 24, the blanket etch stop layer 26 and the blanket second passivating dielectric layer 28 is typically and preferably formed in the location of an inter-metal dielectric (IMD) layer, although such is not otherwise specifically illustrated, nor required, within the schematic cross-sectional diagrams which illustrate the first preferred embodiment of the present invention.

Within the first preferred embodiment of the present invention with respect to the blanket first passivating dielectric layer 24 and the blanket second passivating dielectric layer 28, the blanket first passivating dielectric layer 24 and the blanket second passivating dielectric layer 28 may be formed from any of several passivating dielectric materials as are conventional in the art of microelectronic fabrication, and as have been enumerated in greater detail with respect to the dielectric material from which may be formed the dielectric substrate layer 12. Typically and preferably, the blanket first passivating dielectric layer 24 is formed to a thickness of from about 5000 to about 14000 angstroms, while the blanket second passivating dielectric layer 28 is also formed to a thickness of from about 5000 to about 14000 angstroms. More typically and preferably, each of the blanket first passivating dielectric layer 24 and the blanket second passivating dielectric layer 28 is formed of a silicon oxide dielectric material deposited employing a plasma enhanced chemical vapor deposition (PECVD) method.

Within the first preferred embodiment of the present invention with respect to the blanket etch stop layer 26, although the blanket etch stop layer 26 may similarly also be formed from any of several etch stop materials as are conventional in the art of microelectronic fabrication, including but not limited to conductor etch stop materials and dielectric etch stop materials, for the preferred embodiment of the present invention, the blanket etch stop layer 26 is typically and preferably formed of a dielectric etch stop material, such as but not limited to a silicon nitride dielectric etch stop material, formed to a thickness of from about 200 to about 1200 angstroms interposed between the blanket first passivating dielectric layer 24 and the blanket second passivating dielectric layer 28.

Figure 5:
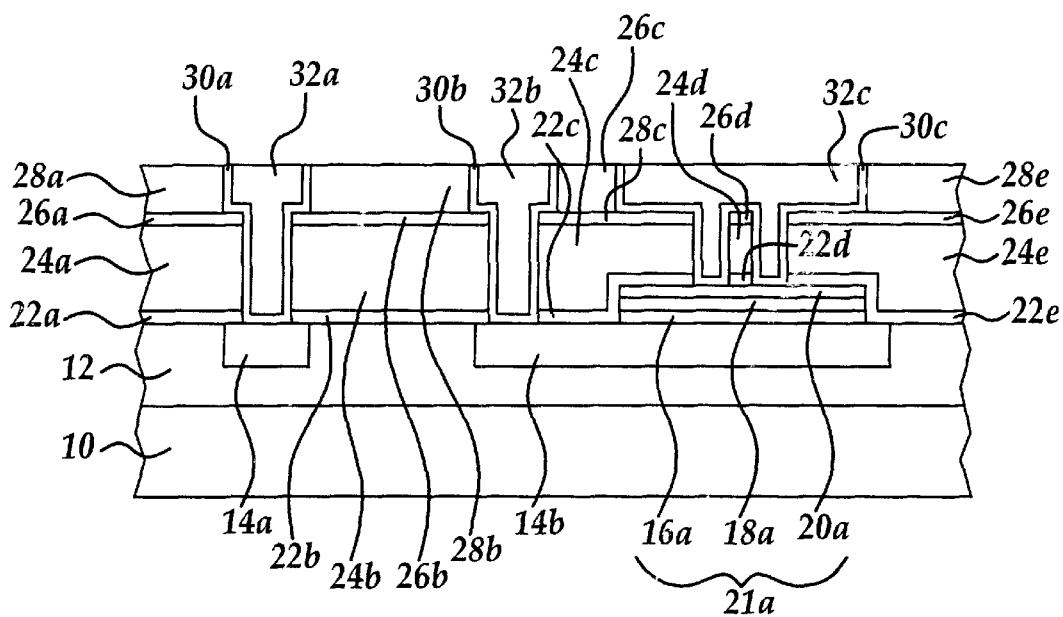

Referring now to FIG. 5, there is shown a schematic cross-sectional diagram illustrating the results of further processing of the microelectronic fabrication whose schematic cross-sectional diagram is illustrated in FIG. 4.

Shown in FIG. 5 is a schematic cross-sectional diagram of a microelectronic fabrication otherwise equivalent to the microelectronic fabrication whose schematic cross-sectional diagram is illustrated in FIG. 4, but wherein in a first instance the series of blanket layers comprising: (1) the blanket third barrier layer 22; (2) the blanket first passivating dielectric layer 24; (3) the blanket etch stop layer 26; and (4) the blanket second passivating dielectric layer 28 have been patterned to form a corresponding series of patterned third barrier layers 22*a*, 22*b*, 22*c*, 22*d* and 22*e*, a corresponding series of patterned first passivating dielectric layers 24*a*, 24*b*, 24*c*, 24*d* and 24*e*, a corresponding series of patterned etch stop layers 26*a*, 26*b*, 26*c*, 26*d* and 26*e* and a corresponding series of patterned second passivating dielectric layers 28*a*, 28*b*, 28*c* and 28*e*. As is illustrated within the schematic cross-sectional diagram of FIG. 5, the series of patterned second passivating dielectric layers 28*a*, 28*b*, 28*c* and 28*e* forms a series of trenches which are contiguous with a series of vias which are formed by the series of patterned etch stop layers 26*a*, 26*b*, 26*c*, 26*d* and 26*e*, the series of patterned first passivating dielectric layers 24*a*, 24*b*, 24*c*, 24*d* and 24*e* and the series of patterned third barrier layers 22*a*, 22*b*, 22*c*, 22*d* and 22*e*. As is understood by a person skilled in the art, the microelectronic structure whose schematic cross-sectional diagram is illustrated in FIG. 5 may in part be formed from the microelectronic structure whose schematic cross-sectional diagram is illustrated in FIG. 4 while employing a two step photolithograph method which forms either the series of trenches first followed by the series of vias, or the series of vias first followed by the series of trenches. Within either of the foregoing two step photolithographic methods, when forming the trenches there is employed an etchant, typically and preferably a reactive ion etch (RIE) plasma etchant, with an increased selectivity of the material from which is formed the blanket second passivating dielectric layer 28 with respect to the material from which is formed the blanket etch stop layer 26.

Finally, there is shown within the schematic cross-sectional diagram of FIG. 5 formed into the series of trenches contiguous with the series of vias a corresponding series of patterned fourth barrier layers 30*a*, 30*b* and 30*c* having formed thereupon a corresponding pair of patterned conductor interconnect and patterned conductor stud layers 32*a* and 32*b* in conjunction with a second copper containing capacitor electrode plate 32*c*. Within the preferred embodiment of the present invention with respect to the series of patterned fourth barrier layers 30*a*, 30*b* and 30*c*, the series of patterned fourth barrier layers 30*a*, 30*b* and 30*c* is typically and preferably formed of a barrier material analogous or equivalent to the barrier material from which is formed the patterned first barrier layer 16*a* and the patterned second barrier layer 20a. Typically and preferably, each of the patterned fourth barrier layers 30a, 30b and 30c is formed to a thickness of from about 100 to about 600 angstroms. Similarly, within the preferred embodiment of the present invention with respect to the pair of patterned conductor interconnect and patterned conductor stud layers 32a and 32b, and the second copper containing capacitor electrode plate 32c, the pair of patterned conductor interconnect and patterned conductor stud layers 32a and 32b, and the second copper containing capacitor electrode plate 32c, are typically and preferably formed employing a damascene method, and more particularly a dual damascene method, wherein a blanket copper containing conductor layer is formed into the series of trenches contiguous with the series of vias and subsequently planarized while employing a chemical mechanical polish (CMP) planarizing method.

When forming the blanket copper containing conductor layer into the series of trenches and contiguous vias, the blanket copper containing conductor layer is formed to a thickness of from about 10000 to about 60000 angstroms while typically and preferably employing a copper containing seed layer formed of a sputtered copper material formed to a thickness from about 40 to about 400 angstroms, followed by a thicker layer of a electroplated copper material formed to provide the thickness of from about 20000 to about 40000 angstroms.

Upon forming the microelectronic fabrication whose schematic cross-sectional diagram is illustrated in FIG. 5, there is formed a microelectronic fabrication having formed therein a microelectronic capacitor structure with enhanced stability. The microelectronic capacitor structure is fabricated with enhanced stability insofar as there is employed when fabricating the microelectronic capacitor structure a pair of barrier layers which separate a pair of copper containing capacitor plate layers from a capacitor dielectric layer.

Second Preferred Embodiment

Figure 6:
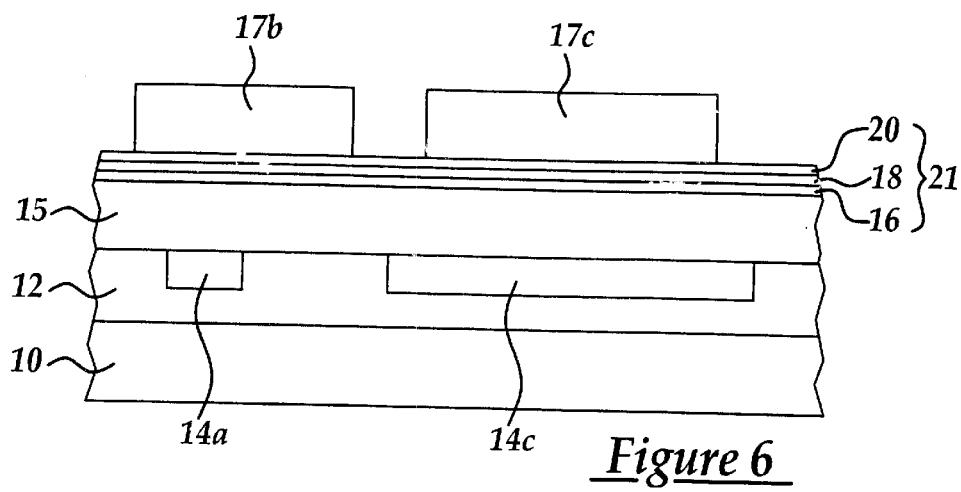
FIG. 6, FIG. 7 and FIG. 8 show a series of schematic cross-sectional diagrams illustrating the results of forming within a microelectronic fabrication in accord with a second preferred embodiment of the present invention a microelectronic capacitor structure within the microelectronic fabrication.
Figure 7:
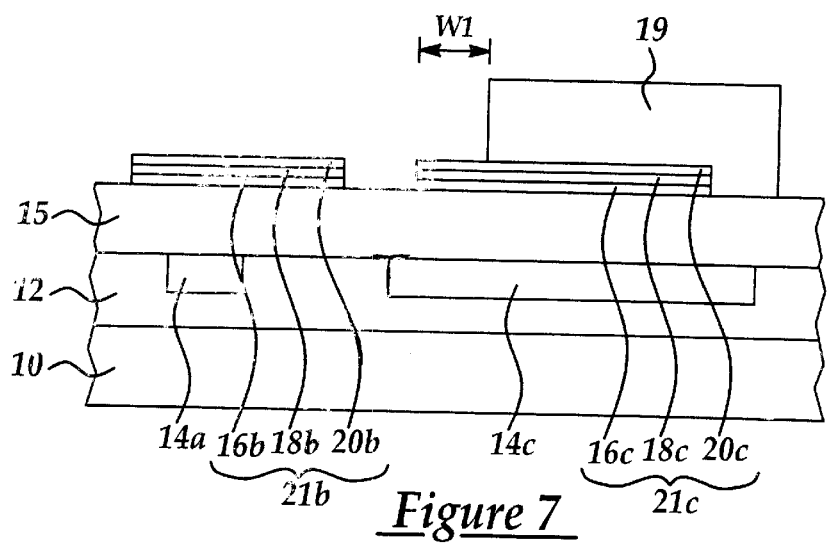
Figure 8:
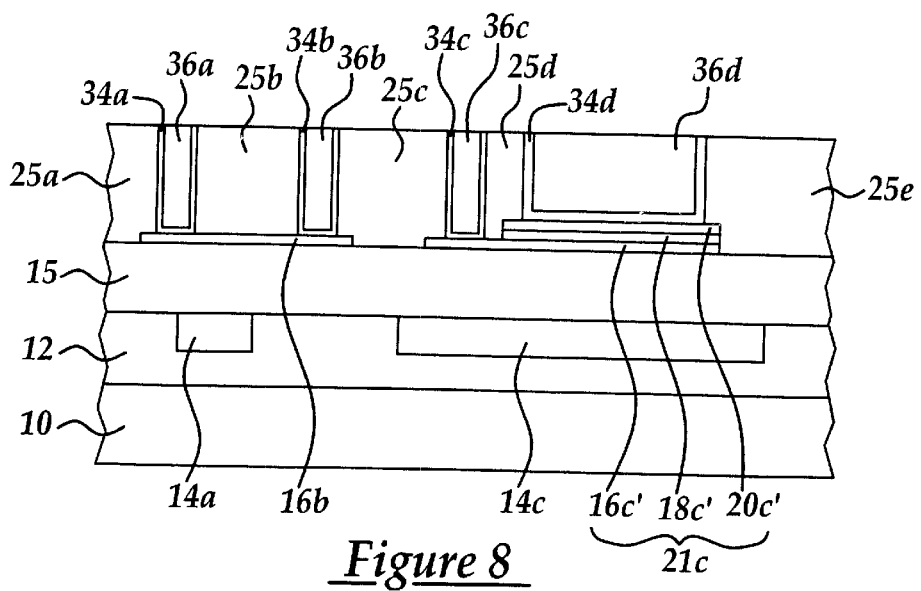

Referring now to FIG. 6 to FIG. 8 there is shown a series of schematic cross-sectional diagrams illustrating the results of forming within a microelectronic fabrication in accord with a second preferred embodiment of the present invention a microelectronic capacitor structure within the microelectronic fabrication. Shown in FIG. 6 is a schematic cross-sectional diagram of the microelectronic fabrication at an early stage in its fabrication in accord with the second preferred embodiment of the present invention.

Shown in FIG. 6, in a first instance, is a substrate 10 having formed thereover a dielectric substrate layer 12 in turn having formed embedded therein a pair of patterned first copper containing interconnect layers 14a and 14c.

Within the second preferred embodiment of the present invention, the substrate 10 is provided employing methods, materials, dimensions and limitations analogous or equivalent to the methods, materials, dimensions and limitations employed for providing the substrate 10 within the first preferred embodiment of the present invention as illustrated within the schematic cross-sectional diagrams of FIG. 1 to FIG. 5. Similarly, within the second preferred embodiment of the present invention with respect to the dielectric substrate layer 12, the dielectric substrate layer 12 is also formed employing methods, materials, dimensions and limitations analogous or equivalent to the methods, materials, dimensions and limitations employed for forming the dielectric substrate layer 12 within the first preferred embodiment of the present invention as illustrated within the schematic cross-sectional diagrams of FIG. 1 to FIG. 5. Finally within the second preferred embodiment of the present invention with respect to both of the patterned first copper containing interconnect layers 14a and 14c, both of the patterned first copper containing interconnect layers 14a and 14c are formed employing methods, materials, dimensions and limitations analogous or equivalent to the methods, materials, dimensions and limitations employed for forming the patterned first copper containing interconnect layer 14a and the first copper containing capacitor electrode plate 14b within the first preferred embodiment of the present invention as illustrated within the schematic cross-sectional diagrams of FIG. 1 to FIG. 5. In contrast with the first preferred embodiment of the present invention, the patterned first copper containing interconnect layer 14c does not serve as a first copper containing capacitor electrode plate, such as the first copper containing capacitor electrode plate 14b as employed within the first preferred embodiment of the present invention as illustrated within the schematic cross-sectional diagrams of FIG. 1 to FIG. 5.

In contrast with the microelectronic capacitor structure of the first preferred embodiment of the present invention as illustrated within the schematic cross-sectional diagram of FIG. 1 to FIG. 2, there is also shown within the microelectronic capacitor structure of the second preferred embodiment of the present invention as illustrated within the schematic cross-sectional diagram of FIG. 6 a blanket first inter-metal dielectric (IMD) layer 15.

Within the second preferred embodiment of the present invention, the blanket first inter-metal dielectric (IMD) layer 15 may be formed employing methods and materials analogous or equivalent to the methods and materials employed for forming the dielectric substrate layer 12 within either the first preferred embodiment of the present invention or the second preferred embodiment of the present invention. Similarly with the dielectric substrate layer 12, the blanket first inter-metal dielectric (IMD) layer 15 will typically and preferably also have formed within its portions which contact the patterned first copper containing interconnect layers 14a and 14c a dielectric barrier material, such as but not limited to a silicon nitride dielectric barrier material, under circumstances where upper lying portions of the blanket first inter-metal dielectric (IMD) layer 15 are formed of a silicon oxide dielectric material which will otherwise interdiffuse with and oxidize the patterned first copper containing interconnect layers 14a and 14c. Typically and preferably, the blanket first inter-metal dielectric (IMD) layer 15 is formed to a thickness of from about 5000 to about 50000 angstroms.

There is also shown within the schematic cross-sectional diagram of FIG. 6 formed upon the blanket first inter-metal dielectric (IMD) layer 15 a series of three blanket layers comprising: (1) a blanket first barrier layer 16 formed upon the blanket first inter-metal dielectric (IMD) layer 15; (2) a blanket capacitor dielectric layer 18 formed upon the blanket first barrier layer 16; and (3) a blanket second barrier layer 20 formed upon the blanket capacitor dielectric layer 18, which three blanket layers in an aggregate form a blanket stack layer 21.

Within the second preferred embodiment of the present invention, the blanket first barrier layer 16 is formed employing methods, materials, dimensions and limitations analogous or equivalent to the methods, materials, dimensions and limitations employed for forming the blanket first barrier layer 16 within the first preferred embodiment of the present invention as illustrated within the schematic cross-sectional diagram of FIG. 2. Similarly, within the second preferred embodiment of the present invention, the blanket capacitor dielectric layer 18 is formed employing methods, materials, dimensions and limitations analogous or equivalent to the methods, materials, dimensions and limitations employed for forming the blanket capacitor dielectric layer 18 within the first preferred embodiment of the present invention as illustrated within the schematic cross-sectional diagram of FIG. 2. Finally, within the second preferred embodiment of the present invention, the blanker second barrier layer 20 is formed employing methods, materials, dimensions and limitations analogous or equivalent to the methods, materials, dimensions and limitations employed for forming the blanket second barrier layer 20 within the first preferred embodiment of the present invention as illustrated within the schematic cross-sectional diagram of FIG. 2.

Finally, there is also shown within the schematic cross-sectional diagram of FIG. 6 a pair of patterned first photoresist layers 17b and 17c formed upon the blanket second barrier layer within the blanket stack layer 21. Within the second preferred embodiment of the present invention, the pair of patterned first photoresist layers 17b and 17c is typically and preferably formed employing methods, materials and dimensions analogous or equivalent to the methods, materials and dimensions employed for forming the patterned photoresist layer 17a within the first preferred embodiment of the present invention as illustrated within the schematic cross-sectional diagram of FIG. 2.

Referring now to FIG. 7, there is shown a schematic cross-sectional diagram illustrating the results of further processing of the microelectronic fabrication whose schematic cross-sectional diagram is illustrated in FIG. 6.

Shown in FIG. 7 is a schematic cross-sectional diagram of a microelectronic fabrication otherwise equivalent to the microelectronic fabrication whose schematic cross-sectional diagram is illustrated in FIG. 6, but wherein, in a first instance: (1) the blanket stack layer 21 has been patterned to form a pair of patterned stack layers 21b and 21c while employing the pair of patterned first photoresist layers 17b and 17c as a pair of first photoresist etch mask layers (where in turn the pair of patterned stack layers 21b and 21c is comprised of a corresponding pair of patterned first barrier layers 16b and 16c having formed thereupon a corresponding pair of patterned capacitive dielectric layers 18b and 18c in turn having formed thereupon a corresponding pair of patterned second barrier layers 20b and 20c); and (2) the pair of patterned first photoresist layers 17b and 17c has been stripped from the microelectronic fabrication.

Within the second preferred embodiment of the present invention, the blanket stack layer 21 may be patterned to form the pair of patterned stack layers 21b and 21c while employing the pair of patterned photoresist layers 17b and 17c as a pair of photoresist etch mask layers, while similarly employing etch methods analogous or equivalent to the etch methods employed for forming from the blanket stack layer 21 within the first preferred embodiment of the present invention as illustrated within the schematic cross-sectional diagram of FIG. 2 the patterned stack layer 21a as illustrated within the schematic cross-sectional diagram of FIG. 3. Similarly, within the second preferred embodiment of the present invention, the pair of patterned first photoresist layers 17b and 17c may be stripped from the pair of patterned second barrier layers 20b and 20c within the pair of patterned stack layers 21b and 21c to provide in part from the microelectronic fabrication whose schematic cross-sectional diagram is illustrated in FIG. 6 the microelectronic fabrication whose schematic cross-sectional diagram is illustrated in FIG. 7 while similarly employing methods and materials analogous or equivalent to the methods and materials employed for stripping from the patterned second barrier layer 20a within the patterned stack layer 21a within the first preferred embodiment of the present invention as illustrated within the schematic cross-sectional diagram of FIG. 2 the patterned first photoresist layer 17a to provide in part the microelectronic fabrication whose schematic cross-sectional diagram is illustrated in FIG. 3.

As is understood by a person skilled in the art, the microelectronic fabrication of the second preferred embodiment of the present invention as illustrated within the schematic cross-sectional diagram of FIG. 7 provides advantage with respect to forming the pair of patterned stack layers 21b and 21c, in comparison with the patterned stack layer 21a formed within the first preferred embodiment of the present invention as illustrated within the schematic cross-sectional diagram of FIG. 3 insofar as there is not exposed within the second preferred embodiment of the present invention either of the patterned first copper containing interconnect layers 14a and 14c when forming the pair of patterned stack layers 21b and 21c and thus within the second preferred embodiment of the present invention neither of the patterned first copper containing interconnect layers 14a or 14c is susceptible to oxidation, corrosion or erosion incident to stripping from the pair of patterned second barrier layers 20b and 20c within the pair of patterned stack layers 21b and 21c the pair of patterned first photoresist layers 17b and 17b to form in part from the microelectronic fabrication whose schematic cross-sectional diagram is illustrated in FIG. 6 the microelectronic fabrication whose schematic cross-sectional diagram is illustrated in FIG. 7.

Finally, there is also shown within the schematic cross-sectional diagram of FIG. 7 a patterned second photoresist layer 19 formed mostly encapsulating the patterned stack layer 21c but not at all encapsulating the patterned stack layer 21b. Within the second preferred embodiment of the present invention, the patterned second photoresist layer 19 is typically and preferably formed employing methods, materials and dimensions analogous or equivalent to the methods, materials and dimensions employed for forming the pair of patterned first photoresist layers 17b and 17c as illustrated within the schematic cross-sectional diagram of FIG. 6. Typically and preferably the patterned second photoresist layer 19 leaves exposed a portion of the patterned stack layer 21c of linewidth W1 from about 0.1 to about 0.1 microns, as illustrated within the schematic cross-sectional diagram of FIG. 7.

Referring now to FIG. 8, there is shown a schematic cross-sectional diagram illustrating the results of further processing of the microelectronic fabrication whose schematic cross-sectional diagram is illustrated in FIG. 7.

Shown in FIG. 8 is a schematic cross-sectional diagram of a microelectronic fabrication otherwise equivalent to the microelectronic fabrication whose schematic cross-sectional diagram is illustrated in FIG. 7, but wherein in a first instance: (1) the patterned stack layer 21b has been etched to remove therefrom the patterned second barrier layer 20b and the patterned capacitor dielectric layer 18b while leaving remaining the patterned first barrier layer 16b; (2) portions of the patterned stack layer 21c are simultaneously etched to form a partially etched patterned stack layer 21c' comprising the patterned first barrier layer 16c extending from beneath one side of a partially etched patterned capacitor dielectric layer 18c' and a partially etched patterned second barrier layer 20c'; and (3) the patterned second photoresist layer 19 is then stripped from the microelectronic fabrication.

Within the second preferred embodiment of the present invention: (1) the patterned stack layer 21b is etched to remove therefrom the patterned second barrier layer 20b and the patterned capacitor dielectric layer 18b while leaving remaining the patterned first barrier layer 16b; and (2) the patterned stack layer 21c is etched to form the partially etched patterned stack layer 21c' comprising the patterned first barrier layer 16c extending from beneath one side of the partially etched patterned capacitor dielectric layer 18c' and the partially etched patterned second barrier layer 20c' while employing etch methods as are conventional in the art of microelectronic fabrication and analogous to the etch method employed for forming from the blanket stack layer 21 within the first preferred embodiment of the present invention as illustrated within the schematic cross-sectional diagram of FIG. 2 the patterned stack layer 21a within the first preferred embodiment of the present invention as illustrated within the schematic cross-sectional diagram of FIG. 3. Consistent with the first preferred embodiment of the present invention, such etch methods will typically and preferably include plasma etch methods.

Within the second preferred embodiment of the present invention when the blanket first barrier layer 16 and the blanket second barrier layer 20 are formed of a tantalum nitride barrier material and the blanket capacitive dielectric layer 18 is formed at least in part of a silicon oxide dielectric material, there is employed within a reactive ion etch (RIE) plasma etch method for: (1) stripping from the blanket stack layer 21b the patterned second barrier layer 20b and the patterned capacitive dielectric layer 18b to leave remaining the patterned first barrier layer 16b; and (2) forming from the patterned stack layer 21c the partially etched patterned stack layer 21c'.

With respect to stripping from the microelectronic fabrication whose schematic cross-sectional diagram is illustrated in FIG. 7 the patterned second photoresist layer 19 to provide in part the microelectronic fabrication whose schematic cross-sectional diagram is illustrated in FIG. 8, the patterned second photoresist layer 19 may be stripped from the microelectronic fabrication whose schematic cross-sectional diagram is illustrated in FIG. 7 to provide in part the microelectronic fabrication whose schematic cross-sectional diagram is illustrated in FIG. 8 while employing photoresist stripping methods and materials as are employed for stripping from the microelectronic fabrication whose schematic cross-sectional diagram is illustrated in FIG. 6 the pair of patterned photoresist layers 17b and 17c to provide in part the microelectronic fabrication whose schematic cross-sectional diagram is illustrated in FIG. 7.

Finally, there is shown within the schematic cross-sectional diagram of FIG. 8 a series of patterned passivation dielectric layers 25a, 25b, 25c, 25d and 25e (which may also serve as a series of patterned second inter-metal dielectric (IMD) layers), where the series of patterned passivation dielectric layers 25a, 25b, 25c, 25d and 25e defines a series of vias, where: (1) a pair of which vias access a pair of opposite ends of the patterned first barrier layer 16b; (2) an additional via accesses the patterned first barrier layer 16c; and (3) a last via accesses the partially etched patterned second barrier layer 20c'.

As is understood by a person skilled in the art, the series of patterned passivation dielectric layers 25a, 25b, 25c, 25d and 25e as illustrated within the schematic cross-sectional diagram of FIG. 8 serves largely an equivalent function as the series of patterned first passivating dielectric layers 24a, 24b, 24c, 24d and 24e, the series of patterned etch stop layers 26a, 26b, 26c, 26d and 26e and the series of patterned second passivating dielectric layers 28a, 28b, 28c and 28e as illustrated within the schematic cross-sectional diagram of FIG. 5. Although the series of patterned passivating dielectric layers 25a, 25b, 25c, 25d and 25e as illustrated within the schematic cross-sectional diagram of FIG. 8 is illustrated has being formed of single layers having straight sidewalls, they may instead be formed as multi-layers having irregular sidewalls corresponding with the related aggregates of layers as illustrated within the schematic cross-sectional diagram of FIG. 5.

Finally, there is also shown within the schematic cross-sectional diagram of FIG. 8 formed into the series of vias defined by the series of patterned passivating dielectric layers 25a, 25b, 25c, 25d and 25e a series of patterned third barrier layers 34a, 34b, 34c and 34d having formed thereupon a corresponding series of patterned conductor stud layers 36a, 36b and 36c, and a copper containing capacitor electrode plate 36d.

Within the second preferred embodiment of the present invention, the series of patterned third barrier layers 34a, 34b, 34c and 34d is typically and preferably formed employing methods, materials and dimensions analogous or equivalent to the methods materials and dimensions employed for forming the series of patterned fourth barrier layers 30a, 30b and 30c within the first preferred embodiment of the present invention as illustrate within the schematic cross-sectional diagram of FIG. 5. Similarly, with the second preferred embodiment of the present invention, the series of patterned conductor stud layers 36a, 36b and 36c, and the copper containing capacitor electrode plate 36d are typically and preferably formed employing methods, materials and dimensions analogous or equivalent to the methods materials and dimensions employed for forming the patterned conductor interconnect and conductor stud layers 32a and 32b, and the second copper containing capacitor plate 32c, as illustrated within the schematic cross-sectional diagram of FIG. 5.

As is understood by a person skilled in the art, within the second preferred embodiment of the present invention there is not employed a first copper containing capacitor electrode plate within a microelectronic capacitor structure analogous to the microelectronics capacitor structure whose schematic cross-sectional diagram is illustrated within FIG. 5, but rather, the patterned first barrier layer 16c serves within the second preferred embodiment of the present invention as a first capacitor plate within a microelectronic capacitor structure which also employs the etched patterned capacitor dielectric layer 18c' as a capacitor dielectric layer, the etched patterned second barrier layer 20c' in part as a second capacitor electrode plate and the copper containing capacitor electrode plate 36d also in part as a capacitor electrode plate. Similarly as is also understood by a person skilled in the art, within the second preferred embodiment of the present invention, the patterned first barrier layer 16b also serves as a resistor formed from the same blanket barrier layer 16 as is formed the patterned first barrier layer 16c which is employed within the microelectronic capacitor structure whose schematic cross-sectional diagram is illustrated in FIG. 8.

As is understood by a person skilled in the art, the preferred embodiments of the present invention are illustrative of the present invention rather than limiting of the present invention. Revisions and modifications may be made to methods, materials, structures and dimensions through which is provided microelectronic capacitor structures in accord with the preferred embodiments of the present invention while still providing microelectronic capacitor structures in accord with the present invention, further in accord with the accompanying claims.

What is claimed is:

1. A capacitor comprising:

a substrate;

a first capacitor electrode plate formed over the substrate, the first capacitor electrode plate being formed of a first copper containing conductor material;

a first conductor barrier layer formed upon the first capacitor electrode plate;

a capacitor dielectric layer formed upon the first conductor barrier layer;

a second conductor barrier layer formed upon the capacitor dielectric layer; and a second capacitor electrode plate formed upon the second conductor barrier layer, the second capacitor electrode plate being formed of a second copper containing conductor material.

2. The capacitor of claim 1, wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The capacitor of claim 1 wherein the first conductor barrier layer and the second conductor barrier layer are formed of a conductor barrier material selected from the group consisting of refractory metal barrier materials, nitrides thereof, alloys thereof, nitrides of alloys thereof, aluminum and aluminum alloys.

4. The capacitor of claim 1 wherein:

the first conductor barrier layer is formed to a thickness of from about 200 to about 1000 angstroms; and the second conductor barrier layer is formed to a thickness of from about 200 to about 1000 angstroms.

* * * * *